(12) United States Patent
Cheng et al.

(10) Patent No.: US 11,171,093 B2
(45) Date of Patent: Nov. 9, 2021

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zhuo Cheng, Beijing (CN); Xiaodong Wang, Beijing (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/703,112

(22) Filed: Dec. 4, 2019

(65) Prior Publication Data

US 2020/0227361 A1 Jul. 16, 2020

(30) Foreign Application Priority Data

Jan. 11, 2019 (CN) .......................... 201910026202.6

(51) Int. Cl.
| | | |
|---|---|---|
| *H01L 23/00* | (2006.01) | |
| *H01L 21/78* | (2006.01) | |
| *H01L 21/768* | (2006.01) | |
| *H01L 21/311* | (2006.01) | |

(52) U.S. Cl.
CPC ...... *H01L 23/562* (2013.01); *H01L 21/31144* (2013.01); *H01L 21/76802* (2013.01); *H01L 21/76877* (2013.01); *H01L 21/78* (2013.01)

(58) Field of Classification Search
CPC . H01L 23/562; H01L 21/78; H01L 21/31144; H01L 21/76877; H01L 21/76802; H01L 23/5283; H01L 23/53214; H01L 23/53228; H01L 23/53257; H01L 21/304
USPC .......................................................... 438/460
See application file for complete search history.

(56) References Cited

U.S. PATENT DOCUMENTS

2012/0326329 A1* 12/2012 Tay ....................... H01L 23/481
257/774

* cited by examiner

*Primary Examiner* — Caleen O Sullivan
(74) *Attorney, Agent, or Firm* — Anova Law Group, PLLC

(57) ABSTRACT

Semiconductor structures and fabrication methods are provided. An exemplary fabrication method includes providing a wafer having a functional region and a non-functional region surrounding the functional region; forming a first dielectric layer on the wafer; forming a first opening in the first dielectric layer in the non-functional region; and forming a first connection layer in the first opening. The first connection layer closes a top portion of the first opening, and a void is formed in the first connection layer in first opening.

20 Claims, 3 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 201910026202.6, filed on Jan. 11, 2019, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

In the manufacturing of semiconductor devices, after forming circuits on a wafer, a wafer dicing process is usually performed on the wafer. The wafer dicing process is a process to separate the wafer into chips having a complete circuit system or individual dies. However, when the wafer dicing process is performed on the wafer to form the chips, it is easy to damage the chips.

The disclosed methods and semiconductor structures are directed to solve one or more problems set forth above and other problems in the art.

BRIEF SUMMARY OF THE DISCLOSURE

One aspect of the present disclosure includes a method for forming a semiconductor structure. The method may include providing a wafer having a functional region and a non-functional region surrounding the functional region; forming a first dielectric layer on the wafer; forming a first opening in the first dielectric layer in the non-functional region; and forming a first connection layer in the first opening. The first connection layer closes a top portion of the first opening; and a void is formed in a portion of the first connection layer in the first opening.

Another aspect of the present disclosure includes a semiconductor structure. The semiconductor structure may include a wafer having a functional region and a non-functional region surrounding the functional region; a first dielectric layer formed on the wafer; a first opening formed in the first dielectric layer in the non-function region of the wafer; and a first connection layer formed in the first opening. The first connection layer closes a top portion of the first opening and a first void is formed in a portion of the first connection layer in the first opening.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
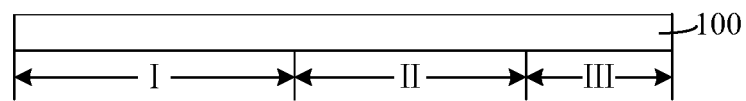
FIG. 1 illustrates a semiconductor structure.

FIG. 1 illustrates a semiconductor structure. As shown in FIG. 1, the semiconductor structure includes a wafer 100. The wafer 100 includes a functional region I, a non-functional region II surrounding the functional region I, and a dicing region III surrounding the non-functional region II.

In such a semiconductor structure, the wafer 100 is subsequently subjected to a wafer dicing process in the dicing region III to form a plurality of individual chips. During the wafer dicing process, the wafer 100 is easily stressed. The stress is spread from the dicing region III to the functional region I. Because there is no structure for preventing the stress in the non-functional region II between the functional region I and the dicing region III, the stress easily spreads to the functional region I. Thus, cracks are easily generated in the chips after the wafer dicing process. Accordingly, the performance of the chips is not as desired, or the chips even fail.

The present disclosure provides a semiconductor structure and a method for forming a semiconductor structure. The wafer may include a functional region and a non-functional region surrounding the functional region. A first dielectric layer may be formed on the wafer; and a plurality of first openings may be formed in the first dielectric layer in the non-functional region. Further, a first connection layer may be formed in the first openings; and the first connection layer may close the top portions of the first openings. The first connection layer may include first voids inside for reducing the stress in the wafer. The semiconductor structure may have an enhanced performance.

Figure 9:
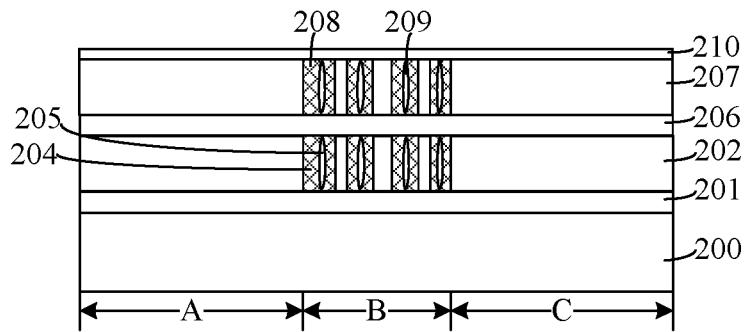
Figure 10:
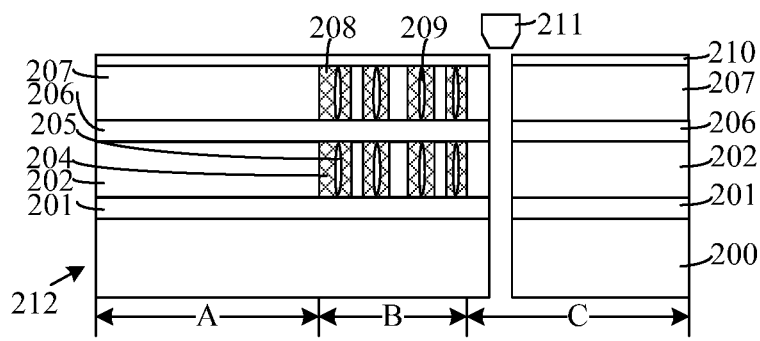
Figure 11:
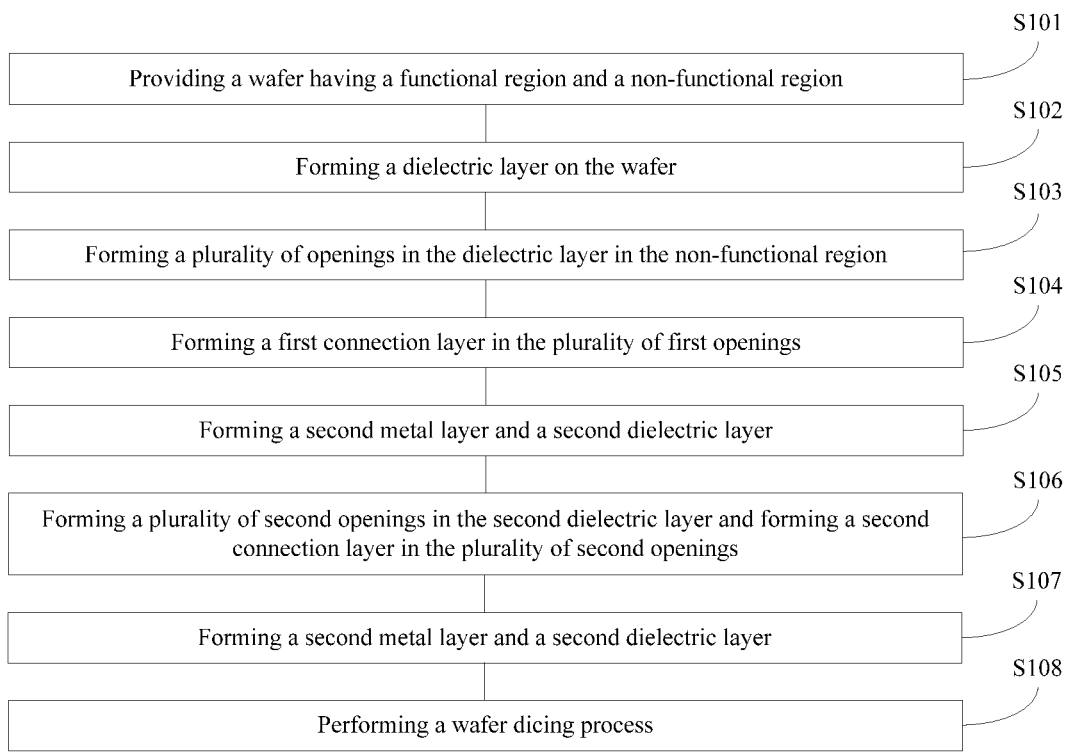
FIG. 11 illustrates an exemplary fabrication process of a semiconductor structure consistent with various disclosed embodiments of the present disclosure.

FIG. 11 illustrates an exemplary fabrication process of a semiconductor structure consistent with various disclosed embodiments of the present disclosure. FIGS. 2-10 illustrate structures corresponding to certain stages during the exemplary fabrication process of the semiconductor structure.

Figure 2:
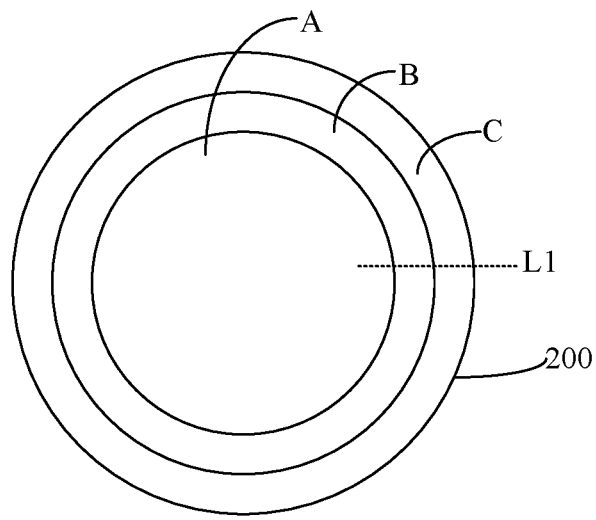
FIGS. 2-10 illustrate structures corresponding to certain stages during an exemplary fabrication process of a semiconductor structure consistent with various disclosed embodiments of the present disclosure.
Figure 3:
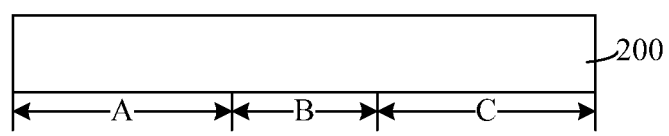

As show in FIG. 11, at the beginning of the fabrication process, a wafer is provided (S101). FIGS. 2-3 illustrate a corresponding structure. FIG. 3 is an L1-sectional view of the structure in FIG. 2; and FIG. 2 is a top view of the structure in FIG. 3.

As shown in FIGS. 2-3, a wafer 200 is provided. The wafer 200 may include a functional region A and a non-functional function B surrounding the functional region A. The wafer 200 may also include a dicing region C surrounding the non-functional region B.

A wafer dicing process may be subsequently performed in the dicing region C of the wafer 200 to form at least one chip. The functional region A may include one or more circuit structures (not shown). A first dielectric layer may be subsequently formed on the non-functional region B of the wafer 200; and the first dielectric layer may include a plurality of first voids. The plurality of first voids may be able to release the stress applied to the wafer 200 and caused by the subsequent wafer dicing process. Accordingly, the formation of cracks in the chip(s) may be prevented, and the failure of the chip(s) may be avoided.

The wafer 200 may be made of any appropriate material. In one embodiment, the wafer 200 is made of silicon.

Figure 4:
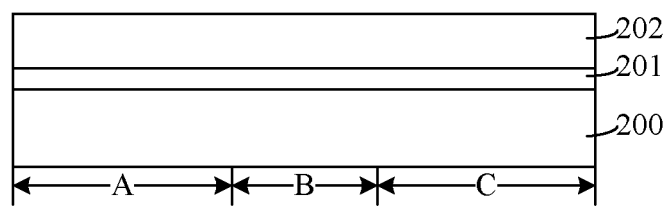

Returning to FIG. 11, after providing the wafer, a first dielectric layer may be formed (S102). FIG. 4 illustrates a corresponding semiconductor structure. The sectional view FIG. 4 illustrates a same sectional view of the wafer in FIG. 3

As shown in FIG. 4, a first dielectric layer 202 may be formed on the surface of the wafer 200. Before forming the first dielectric layer 202, a first metal layer 201 may be formed on the surface of the wafer 200. The first metal layer 201 may be connected to a subsequently formed first connection layer.

The first metal layer 201 may be made of any appropriate metal material. In one embodiment, the first metal layer 201 is made of copper. In another embodiment, the first metal layer may be made of aluminum, or tungsten, etc.

Various processes may be used to form the first metal layer 201, such as a chemical vapor deposition (CVD) process, or a physical vapor deposition (PVD) process, etc.

The first dielectric layer 202 may be made of any appropriate material, such as silicon oxide, or silicon oxynitride, etc. Various processes may be used to form the first dielectric layer 202, such as a chemical vapor deposition (CVD) process, or a physical vapor deposition (PVD) process, etc.

The fracture toughness of the material of the first metal layer 201 may be greater than the fracture toughness of the material of the first dielectric layer 202, and the stress tends to propagate along a direction in which the fracture toughness of the material is weak. Thus, the first metal layer 201 may guide the propagation of the stress; and may reduce the stress reaching the functional region A. Accordingly, the damage of the stress to the functional region A may be reduced.

Figure 5:
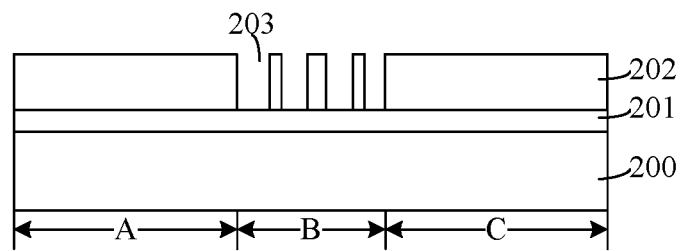

Returning to FIG. 11, after forming the first dielectric layer, a first opening may be formed (S103). FIG. 5 illustrates a corresponding semiconductor structure.

As shown in FIG. 5, a first opening 203 may be formed in the portion of the first dielectric layer 202 in the non-functional region B. The bottom surface of the first opening 203 may expose a top surface of the first metal layer 201. In one embodiment, more than one first opening 203 is formed in the first dielectric layer 202.

The method for forming the plurality of first openings 203 may include forming a first mask layer (not shown) on the top surface of the first dielectric layer 202. The first mask layer may expose portions of the top surface of first dielectric layer 202 in the non-functional region B. Then, the first dielectric layer 202 may be etched using the first mask layer as an etching mask to form the plurality of first openings 203 in the first dielectric layer 202 in the non-functional region B.

The first mask layer may be made of any appropriate material, such as silicon nitride, or titanium nitride, etc. The first mask layer may define the positions and sizes of the plurality of first openings 203.

The process for etching the first dielectric layer 202 using the first mask layer as the etching mask may include one or a combination of a dry etching process and a wet etching process, etc.

The aspect ratio of each of the plurality of first openings 203 may be in a range of approximately 1:1 to 11:1. If the aspect ratio of the first openings 203 is less than approximately 1:1, the first openings 203 may have a substantially small depth; and the first voids may not be formed in the subsequently formed first connection layer in the first openings 203. During the subsequent wafer dicing process in the dicing region C, a stress may be easily generated in the wafer 200; and the stress may propagate into the functional region A. Accordingly, the chips may be susceptible to damages, or even fail. If the aspect ratio of the first openings 203 is greater than approximately 11:1, it may be more difficult to form the first openings 203.

In one embodiment, because the depth of each of the plurality of first openings 203 may be substantially large, when the first connection layer is subsequently formed in the first openings 203, the growth rate of the first connection layer in the top portions of the first openings 203 may be greater than the growth rate of the first connection layer middle of the first openings 203. Thus, the first connection layer may close the top portions of the first openings 203 in advance. In particular, the first connection layer may include a plurality of first voids. Accordingly, when the stress is generated in the dicing region C of the wafer during the wafer dicing process and propagates, the first voids may be able to scatter the stress such that the stress reaching the function region A may be substantially small. Thus, the damage to the functional region A of the wafer 200 may be significantly reduced; and the quality of the formed chips may be improved.

In one embodiment, the number of the first openings 203 is three. In some embodiments, the number of the first openings may be one, one to two, or more than three.

Figure 6:
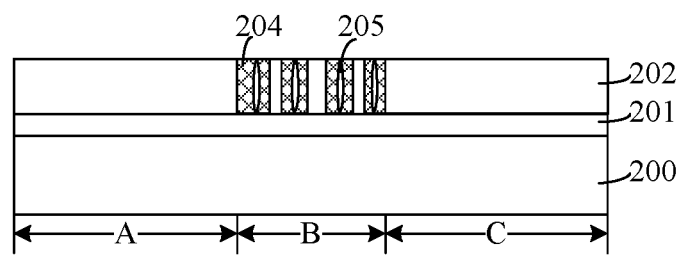

Returning to FIG. 11, after forming the plurality of first openings, a first connection layer may be formed (S104). FIG. 6 illustrates a corresponding semiconductor structure.

As shown in FIG. 6, a first connection layer 204 may be formed in the first opening 203. In one embodiment, the first connection layer 204 may be formed in the plurality of the first openings 203. The first connection layer 204 may close the top portions of the first openings 203. In particular, a first void 205 may be formed in the portion of the first connection layer 204 in each of the plurality of first openings 203.

The method for forming the first connection layer 204 may include forming a first connection material film in the first openings 203 and on the top surface of the first dielectric layer 202. The first connection material film may close the top portions the first openings 203. Then, the first connection material film may be planarized until the first dielectric layer 202 is exposed to form the first connection layer 204. The first connection layer 204 may close the top portions of the first openings 203. The first connection layer 204 may have a plurality of first voids 205. In particular, a void 205 is formed in the portion of the first connection layer 204 in each of the plurality of first openings 203.

The first connection material film may be made of a metal material. Various processes may be used to form the first connection material film, such as a chemical vapor deposition (CVD) process, or a physical vapor deposition (PVD) process, etc.

In one embodiment, the first connection material film is made of copper, and the first connection material film is formed by a CVD process. The CVD process may include a reactive gas. In the process for forming the first connection material film by the CVD process, the reactive gas may enter the first openings 203 from the top of the first openings 203, and the concentration of the reactive gas in the top portions of the first openings 203 may be greater than the concentration of the reactive gas in middle portions of the openings 203. Thus, the thickness of the first connection material film formed in the top portions of the first openings 203 may be greater than the thickness of the first connection material film formed the middle portions of the first openings 203. After a period of time, the first connection material film may close the top portions of the first openings 203, but the middle portions of the first openings may not be filled by the first connection material film. Thus, the first voids 205 may be formed in the middle of the portions of the first connection material film inside of the first openings 203. When the wafer 200 is subsequently subjected to a wafer dicing process in the dicing region C; and when the stress generated in the wafer 200 propagates to the first voids 205, the first voids 205 may be able to scatter the stress. Thus, the stress reaching the functional region A may be substantially small; and the damage to the functional region A may be reduced.

In one embodiment, the first connection layer 204 is made of a metal material; and the first dielectric layer 202 is made of silicon oxide. Thus, the fracture toughness of the first connection layer 204 may be greater than the fracture toughness of the first dielectric layer 202. The stress may tend to propagate along a direction in which the fracture toughness is weak. Thus, the first connection layer 204 may guide the propagation direction of the stress such that the stress reaching the functional region A is substantially small. Accordingly, the damage to the functional region A may be reduced.

The first connection material film may be planarized by any appropriate process. In one embodiment, a chemical mechanical polishing (CMP) process is used to planarize the first connection material film.

In one embodiment, the first connection layer 204 may be used to form an electrical connection between the first metal layer 201 and a subsequently formed second metal layer.

Figure 7:
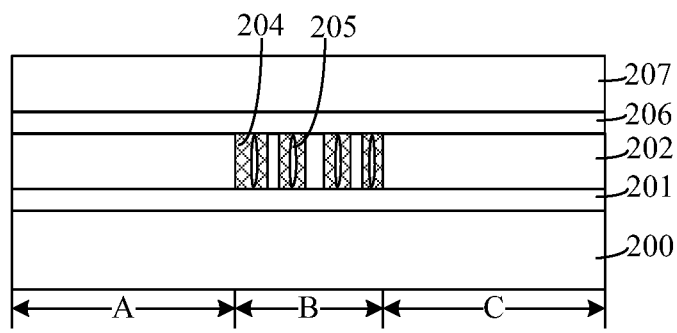

Returning to FIG. 11, after forming the first connection layer, a second metal layer and a second dielectric layer may be formed (S105). FIG. 7 illustrates a corresponding semiconductor structure.

As shown in FIG. 7, a second metal layer 206 may be formed on the top surface the first dielectric layer 202 and the top surface of the first connection layer 204. Further, a second dielectric layer 207 may be formed on the second metal layer 206.

The second metal layer 206 may be made of a metal material, etc.; and the second metal layer 206 may be formed by a CVD process, or a PVD process, etc. The second dielectric layer 207 may be made of silicon oxide, or silicon oxynitride, etc.; and the second dielectric layer 207 may be formed by a CVD process, or a PVD process, etc.

In one embodiment, the second metal layer 206 is made of copper; and the second dielectric layer 207 is made of silicon oxide. The fracture toughness of the second metal layer 206 may be greater than the fracture toughness of the second dielectric layer 207; and the stress tends to propagate along a direction in which the fracture toughness is weak. Thus, the second metal layer 206 may guide the propagation direction of the stress generated by the wafer dicing process. Accordingly, the stress reaching the functional region A may be substantially small; and the damage to the functional region A may be reduced.

In one embodiment, the second metal layer 206 and the second dielectric layer 207 may be formed. In some embodiments, the second metal layer and the second dielectric layer may be omitted.

Figure 8:
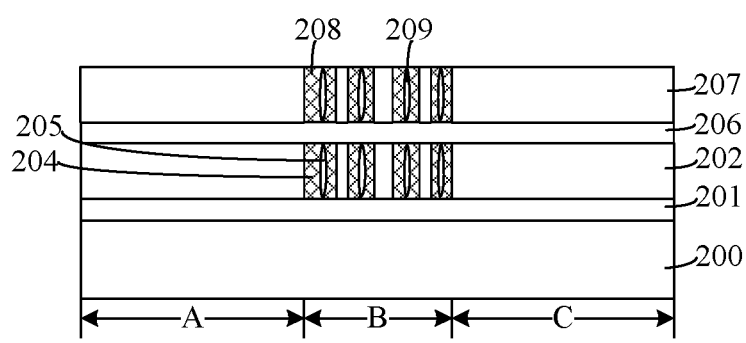

Returning to FIG. 11, after forming the second metal layer and the second dielectric layer, a plurality of second openings and a second connection layer may be formed (S106). FIG. 8 illustrates a corresponding semiconductor structure.

As shown in FIG. 8, a plurality of second openings (not labeled) may be formed in the second dielectric layer 207 in the non-functional region B, and the bottoms of the plurality of second openings may expose the second metal layer 206.

Further, a second connection layer 208 may be formed in the plurality of second openings. The second connection layer 208 may close the top portions of the second openings, and the second connection layer 208 may have a plurality of second voids 209 inside. In particular, one second void 209 may be formed in the portion of the second connection layer 208 in each of the plurality of second openings.

The method for forming the second openings may be the same as the method for forming the first openings, and the details may be referred to the above description.

In one embodiment, the aspect ratio of the second openings may be in in a range of approximately 1:1 to 11:1; and the depth of the second openings may be substantially large. Thus, when the second connection layer 208 closes the top portions of the second openings, the second openings may not be completely filled. In particular, the second void 209 may be formed in the portion of the second connection layer 208 in each of the plurality of second openings. When the wafer 200 is subsequently subjected to a wafer dicing process in the dicing region C; and when the stress generated in the wafer 200 propagates to the second voids 209, the second voids 209 may be able to scatter the stress. Thus, the stress reaching the functional region A may be substantially small. Accordingly, the damage to the functional region A may be reduced; and the quality of the subsequently formed chips may be as desired.

The forming method and the material of the second connection layer 208 may be the same as the forming method and the material of the first connection layer 204, and the details may be referred to the above description.

The second connection layer 208 may be used to form an electrical connection between the second metal layer 206 and the subsequently formed third metal layer.

In one embodiment, for illustrative purposes, the layer number of the second dielectric layer 207 is one. In some embodiments, the layer number of the second dielectric layer may be greater than one, and a second connection layer may be formed in each layer of the second dielectric layer. After forming one second connection layer and before forming a next second connection layer, a third metal layer may be formed on the surface of the second connection layer and the second dielectric layer; and the second openings may penetrate through the second dielectric layer.

In one embodiment, the number of the second openings in each layer of the second dielectric layer 207 is three. In some embodiments, the number of second openings in each layer of the second dielectric layer may be one, one to two, or more than three.

Returning to FIG. 11, after forming the second metal layer and the second dielectric layer, a top metal layer may be formed (S107). FIG. 9 illustrates a corresponding semiconductor structure.

As shown in FIG. 9, a top metal layer 210 may be formed on the surface of the second dielectric layer 207 and the surface of the second connection layer 208.

The material and formation process of the top metal layer 210 may be the same as the material and formation process of the first metal layer 201, and the details may be referred to the above descriptions.

The top metal layer 210 may be connected to the second connection layer 208.

In one embodiment, the top metal layer 210 may be made of metal; and the second dielectric layer 207 may be made of silicon oxide. The fracture toughness of the top metal layer 210 may be greater than the fracture toughness of the second dielectric layer 207. The stress tends to propagate along a direction in which the fracture toughness is weak.

Thus, the top metal layer 210 may be able to guide the propagation of the stress; and during the subsequent wafer dicing process, the stress generated in the dicing region C of the wafer 200 may be easy to propagate along the interface between the top metal layer 210 and the second dielectric layer 207 to cause the stress to travel farther. Thus, the stress reaching the functional region A may be substantially. Accordingly, the damage to the functional region A may be reduced; and the performance of the formed chips may be improved.

Returning to FIG. 11, after forming the top metal layer, a wafer dicing process may be performed to form a plurality of chips (S108). FIG. 10 illustrates a corresponding semiconductor structure.

As shown in FIG. 10, a wafer dicing process is performed on the dicing region C of the wafer 200 to form a plurality of chips 212. For illustrative purposes, one chip 212 is shown in FIG. 10.

The cutting tool 211 of the wafer dicing process may be a saw blade. In some embodiments, the wafer dicing process may be a laser cutting process, etc.

During the wafer dicing process, because the first dielectric layer 202 may have a plurality of first voids 205, when the stress generated in the wafer 200 by the cutting tool 211 propagates to the first voids 205, the first voids 205 may be able to release the stress such that the stress reaching the functional region A may be substantially small. Thus, the formed chips 212 may be less prone to cracking; and the performance of the chips 212 may be improved.

In one embodiment, the second dielectric layer 207 may also be formed; and the second connection layer 208 may be formed in the second dielectric layer 207. The second connection layer 208 may have a plurality of second voids 209. When the stress generated in the wafer by the cutting tool 211 propagates to the second voids 209, the second voids 209 may be able to release the stress such that the stress reaching the functional region A may be substantially small. Thus, the formed chips 212 may be less likely to have cracks, and the performance of the chips 212 may be improved.

The present disclosure also provides a semiconductor structure. FIG. 9 illustrates an exemplary semiconductor structure consistent with various disclosed embodiments of the present disclosure:

As shown in FIG. 9, the semiconductor structure includes a wafer 200. The wafer 200 may include a functional region A and a non-functional region B surrounding the functional region A. A first dielectric layer 202 may be formed on the surface of the wafer 200. Further, the semiconductor structure may include a plurality of first openings 203 formed in the first dielectric layer 202 in the non-functional region B; and a first connection layer 204 formed in the first openings 203. The first connection layer 204 may close the top portions of the first openings 203; and the first connection layer 204 may include a plurality of first voids 205. In particular, a first void 205 may be formed in the portion of the first connection layer 204 in each of the first openings 203. The aspect ratio of each of the first openings 203 may be in a range of approximately 1:1 to 11:1.

Further, the semiconductor structure may include a first metal layer 201 formed between the first dielectric layer 202 and the wafer 200. The first openings 203 may penetrate through the first dielectric layer 202.

The first connection layer 204 may be made of a metal material. In one embodiment, the first connection layer 204 may be made of copper, aluminum, or tungsten, etc.

Further, the semiconductor structure may include a second metal layer 206 formed on the surface of the first dielectric layer 202 and the surface of the first connection layer 204.

The wafer 200 may also include a dicing region C. The dicing region C may surround the non-functional region B. The detailed structures and intermediate structures are described above with respect to the fabrication processes In the disclosed method for forming a semiconductor structure, the wafer is subsequently subjected to a wafer dicing process in a dicing region surrounding the non-functional region, and the stress generated in the wafer by the wafer dicing process may propagate from the dicing region to the functional region. The functional region may be located between the dicing region and the functional region. Thus, the stress may first propagate to the non-functional region. The first dielectric layer in the non-functional region may have a plurality of first openings; and a first connection layer may be subsequently formed in the plurality of first openings. Because the first connection layer may close the top portions of the first openings and the first connection layer may have a plurality of first voids, when the stress propagates to the first voids, the first voids may be able to scatter the stress. Accordingly, the stress reaching the functional region of the wafer may be substantially small. Thus, the damage of the stress to the functional region of the wafer may be reduced; and the quality of the chips formed by the wafer dicing process may be as desired.

Further, a first metal layer may be formed between the first dielectric layer and the wafer, and the first openings may penetrate through the first dielectric layer. The first connection layer formed in the first openings may be made of a metal material, and a second metal layer may be subsequently formed on the surface of the first dielectric layer and the surface of the first connection layer. Because the fracture toughness of the metal material may be greater than the fracture toughness of the material of the first dielectric layer, and the stress tends to propagate along a direction in which the fracture toughness of the material is weak, the first metal layer, the first connection layer and the second metal layer may guide the propagation of the stress such that the stress may propagate further. Accordingly, the stress reaching the functional region may be substantially small, and the damage to the functional region of the wafer may be reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a wafer having a functional region and a non-functional region surrounding the functional region;
   forming a first dielectric layer on the wafer;
   forming a first opening in the first dielectric layer on the non-functional region of the wafer, wherein the first opening has a cutoff at an interface between the wafer and the first dielectric layer; and
   forming a first connection layer in the first opening, wherein the first connection layer closes a top portion of the first opening, and a first void is formed in the first connection layer in the first opening.

2. The method according to claim 1, wherein:
an aspect ratio of the first opening is in a range of approximately 1:1 to 11:1.

3. The method according to claim 1, further comprising:
forming a first metal layer between the wafer and the first dielectric layer.

4. The method according to claim 1, wherein:
the first opening penetrates through the first dielectric layer.

5. The method according to claim 1, wherein:
the first connection layer is made of a metal material.

6. The method according to claim 5, wherein:
the first connection layer is made of one of copper, aluminum, and tungsten; and
the first connection layer is formed by one of a chemical vapor deposition process, a physical vapor deposition process and an atomic layer deposition process.

7. The method according to claim 1, further comprising:
forming a second metal layer on the first dielectric layer and the first connection layer.

8. The method according to claim 7, after forming the second metal layer, further comprising:
forming at least one second dielectric layer on the second metal layer;
forming a second opening in each layer of the at least one second dielectric layer; and
forming a second connection layer in the second opening, wherein the second connection layer closes a top portion of the second opening and a second void is formed in the second connection layer in the second opening.

9. The method according to claim 8, wherein:
an aspect ratio of the second opening is in a range of approximately 1:1 to 11:1.

10. The method according to claim 8, wherein when the at least one second dielectric layer includes more than one second dielectric layer, after forming one layer of the second dielectric layer and before forming a next layer of the second dielectric layer, the method further comprises:
forming a third metal layer on the second connection layer and the second dielectric layer,
wherein the second opening penetrates through the second dielectric layer.

11. The method according to claim 10, wherein the wafer also includes a dicing region and the dicing region surrounds the non-functional region, and after forming the first connection layer, the method further comprises:
performing a wafer dicing process on the dicing region of the wafer to form a plurality of chips.

12. The method according to claim 8, wherein:
the second opening in each layer of the at least one second dielectric layer includes one or more second openings.

13. The method according to claim 1, wherein:
the first opening includes one or more first openings.

14. A method for fabricating a semiconductor structure, comprising:
providing a wafer having a functional region and a non-functional region surrounding the functional region;
forming a first dielectric layer on the wafer;
forming a first opening in the first dielectric layer on the non-functional region of the wafer;
forming a first connection layer in the first opening, wherein the first connection layer closes a top portion of the first opening, and a first void is formed in the first connection layer in the first opening; and
forming a first metal layer between the wafer and the first dielectric layer, wherein forming the first opening comprises:
forming a first mask layer exposing a portion of a surface of the first dielectric layer in the non-functional region on the first dielectric layer; and
etching the first dielectric layer using the first mask layer as an etching mask until the first metal layer is exposed to form the first opening in the first dielectric layer.

15. The method according to claim 14, wherein:
an aspect ratio of the first opening is in a range of approximately 1:1 to 11:1.

16. The method according to claim 14, wherein:
the first opening penetrates through the first dielectric layer.

17. The method according to claim 14, wherein:
the first connection layer is made of a metal material.

18. The method according to claim 17, wherein:
the first connection layer is made of one of copper, aluminum, and tungsten; and
the first connection layer is formed by one of a chemical vapor deposition process, a physical vapor deposition process and an atomic layer deposition process.

19. The method according to claim 14, further comprising:
forming a second metal layer on the first dielectric layer and the first connection layer.

20. The method according to claim 14, wherein:
the first opening includes one or more first openings.

* * * * *